US010554016B2

(12) United States Patent
Kuriaki

(10) Patent No.: US 10,554,016 B2
(45) Date of Patent: Feb. 4, 2020

(54) LASER LIGHT SOURCE DEVICE AND METHOD OF CONTROLLING SAME

(71) Applicant: MITSUBISHI ELECTRIC CORPORATION, Tokyo (JP)

(72) Inventor: Makoto Kuriaki, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/068,170

(22) PCT Filed: Mar. 8, 2016

(86) PCT No.: PCT/JP2016/057147
§ 371 (c)(1),
(2) Date: Jul. 5, 2018

(87) PCT Pub. No.: WO2017/154096
PCT Pub. Date: Sep. 14, 2017

(65) Prior Publication Data
US 2019/0044305 A1    Feb. 7, 2019

(51) Int. Cl.
*H01S 5/068*  (2006.01)
*H01S 5/042*  (2006.01)
(Continued)

(52) U.S. Cl.
CPC .......... *H01S 5/06825* (2013.01); *H01S 5/042* (2013.01); *H01S 5/06804* (2013.01);
(Continued)

(58) Field of Classification Search
CPC . H01S 5/06825; H01S 5/0683; H01S 5/06804
See application file for complete search history.

(56) References Cited

U.S. PATENT DOCUMENTS

2011/0221714 A1    9/2011  Kuriaki
2016/0255313 A1*   9/2016  Samejima .......... G03B 21/2033
                                                       353/85

FOREIGN PATENT DOCUMENTS

JP    61-63074 A    4/1986
JP    1-215080 A    8/1989
(Continued)

OTHER PUBLICATIONS

International Search Report for PCT/JP2016/057147 (PCT/ISA/210) dated Jun. 7, 2016.
(Continued)

*Primary Examiner* — Michael Carter
(74) *Attorney, Agent, or Firm* — Birch, Stewart, Kolasch & Birch, LLP

(57) ABSTRACT

An object is to provide a technology capable of suppressing life deterioration of a laser light source device. A laser light source device includes a laser bank having a plurality of semiconductor laser elements, a drive part for applying an electric current to the plurality of semiconductor laser elements of the laser bank, a light intensity detection part for detecting light intensity output from the laser bank, a temperature detection part for detecting a temperature of the laser bank, and a control part for determining an electric current limit value based on the detected temperature, and for controlling the electric current of the drive part based on the detected light intensity and the electric current limit value.

4 Claims, 4 Drawing Sheets

(51) Int. Cl.
　　　*H01S 5/0683*　　(2006.01)
　　　*H01S 5/06*　　　(2006.01)
　　　*H01S 5/40*　　　(2006.01)
　　　*H01S 5/024*　　 (2006.01)

(52) U.S. Cl.
　　　CPC ....... *H01S 5/02415* (2013.01); *H01S 5/02423* (2013.01); *H01S 5/0617* (2013.01); *H01S 5/0683* (2013.01); *H01S 5/4018* (2013.01); *H01S 5/4025* (2013.01)

(56) References Cited

FOREIGN PATENT DOCUMENTS

| | | |
|---|---|---|
| JP | 4-123481 A | 4/1992 |
| JP | 2009-21506 A | 1/2009 |
| JP | 2011-191526 A | 9/2011 |
| JP | 2012-169768 A | 9/2012 |
| JP | 2015-99768 A | 5/2015 |

OTHER PUBLICATIONS

The International Preliminary Report of Patentability and the Written Opinion of the International Search Authority dated Sep. 20, 2018 in PCT/JP2016/057147.
Office Action dated Jun. 18, 2019 in corresponding Canadian Application No. 3,016,276.

\* cited by examiner

LASER LIGHT SOURCE DEVICE AND METHOD OF CONTROLLING SAME

TECHNICAL FIELD

The present invention relates to a laser light source device including a semiconductor laser element, and to a method of controlling the laser light source device.

BACKGROUND ART

As light sources of a lighting device and a display device, semiconductor laser elements have been used as the light sources in place of a lamp. With use of a plurality of semiconductor laser elements, an optical output larger than that of a lamp can be obtained, and a wider color reproduction range and a longer life of a light source can also be achieved. Note that, it is known that the semiconductor laser elements have high dependency upon temperature, and maintain a larger output and a longer life as the temperature is lower. Therefore, a Peltier element, a water-cooling cooling mechanism, and the like are proposed as cooling means for the semiconductor laser elements (Patent Document 1). However, as means of compensating for the temperature dependency of the semiconductor laser elements, compensation means of using an optical output automatic control (or automatic power control: hereinafter abbreviated as "APC") circuit for controlling an optical output by making an adjustment to an input electric current, not to the temperature, is generally adopted (Patent Document 2).

PRIOR ART DOCUMENTS

Patent Documents

Patent Document 1: Japanese Patent Application Laid-Open No. 2011-191526
Patent Document 2: Japanese Patent Application Laid-Open No. 4-123481 (1992)

SUMMARY

Problem to be Solved by the Invention

In recent years, due to the increase in optical output of light sources, a large number of semiconductor laser elements have been used. As the characteristics of the semiconductor laser element, conversion efficiency is high and a large optical output is obtained under low temperature, but conversion efficiency is deteriorated and an optical output is lowered under high temperature. Basically, the semiconductor laser element is desirably used in low temperature where conversion efficiency is high. However, in a case where an optical output is excessively large at the time of low temperature, catastrophic optical damage (catastrophic optical damage: hereinafter also abbreviated as "COD") may occur in an end surface of the laser element. In addition, in a case where pulse driving is carried out, the use with its optical output suppressed by a high-speed APC is required.

Here, in the use of a plurality of semiconductor laser elements, in a case where one drive circuit and one APC circuit are provided to each of the semiconductor laser elements as in the configuration of FIG. 1 of Patent Document 1, a circuit scale is increased. Accordingly, a method of connecting a plurality of semiconductor laser elements to a single drive circuit to be driven is conceivable. In this case, as the APC, the optical output is controlled by a total light intensity value of outputs of the plurality of semiconductor laser elements.

However, with such control, optical output values of individual semiconductor laser elements cannot be grasped. If outputs of some of the semiconductor laser elements are extremely low, the entire electric current value may be increased due to the APC, and optical outputs of other semiconductor laser elements whose optical outputs are not lowered may be extremely large. Similarly, in a case where the temperature of the semiconductor laser elements is low, even with the same electric current, an optical output may be extremely large. As a result of the above, there has been a problem in that life deterioration is generated due to COD.

Accordingly, the present invention has been made in view of the problems as described above, and has an object to provide a technology capable of suppressing life deterioration of a laser light source device.

Means to Solve the Problem

A laser light source device according to the present invention includes a laser bank having a plurality of semiconductor laser elements, a drive part for applying an electric current to the plurality of semiconductor laser elements of the laser bank, a light intensity detection part for detecting light intensity output from the laser bank, a temperature detection part for detecting a temperature of the laser bank, and a control part for determining an electric current limit value being a limit value of the electric current of the drive part based on the temperature detected by the temperature detection part, and for controlling the electric current of the drive part based on the light intensity detected by the light intensity detection part and the electric current limit value.

Effects of the Invention

According to the present invention, the electric current limit value is determined based on the temperature of the laser bank, and the electric current of the drive part is controlled based on the light intensity detected by the light intensity detection part and the electric current limit value. With this, life deterioration of the laser light source device can be suppressed.

An object, features, aspects, and advantages of the present invention become more obvious with the following detailed description and the attached drawings.

DESCRIPTION OF EMBODIMENT

First Embodiment

Figure 1:
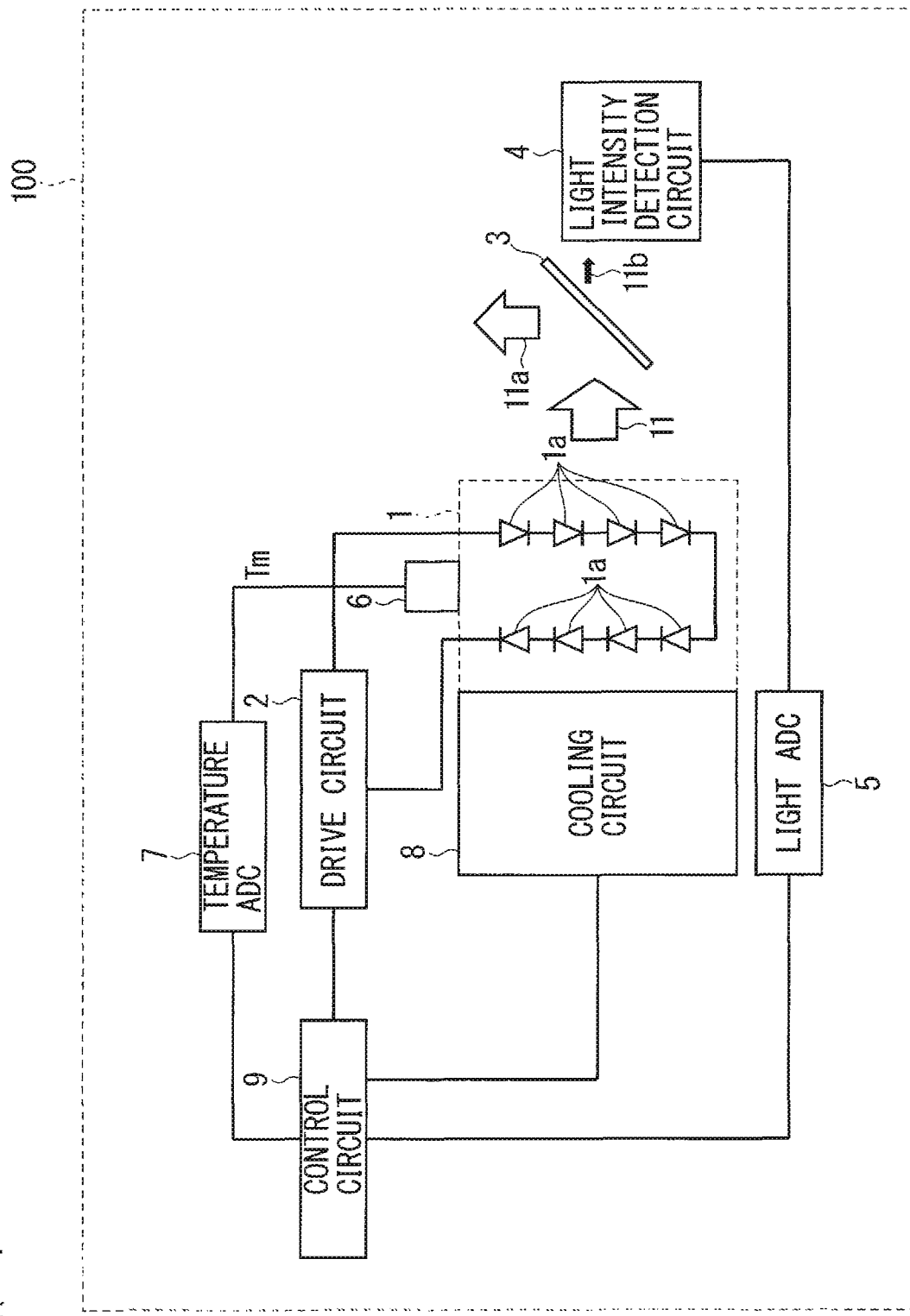
FIG. 1 is a block diagram schematically illustrating a configuration of a laser light source device according to a first embodiment.

FIG. 1 is a block diagram schematically illustrating a configuration of a laser light source device 100 according to a first embodiment of the present invention. The laser light source device 100 of FIG. 1 includes a semiconductor laser bank 1 being a laser bank, a drive circuit 2 being a drive part, a mirror 3, a light intensity detection circuit 4, a light ADC (analog-to-digital converter circuit) 5, a temperature detection circuit 6 being a temperature detection part, a temperature ADC (analog-to-digital converter circuit) 7, a cooling circuit 8, and a control circuit 9 being a control part for integrally controlling these components.

The semiconductor laser bank 1 has a plurality of semiconductor laser light source elements (semiconductor laser elements) 1a.

The drive circuit 2 applies an electric current to the plurality of semiconductor laser light source elements 1a of the semiconductor laser bank 1. The electric current applied from the drive circuit 2 to the plurality of semiconductor laser light source elements 1a is controlled by the control circuit 9. Note that, an electric current (output) from the drive circuit 2 may be either of a pulsed current or a direct current.

Figure 2:
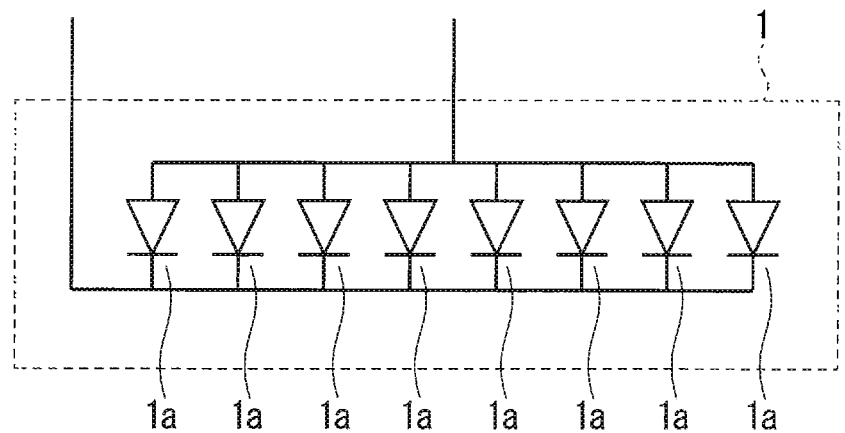
FIG. 2 is a diagram schematically illustrating another configuration of the semiconductor laser bank according to the first embodiment.
Figure 3:
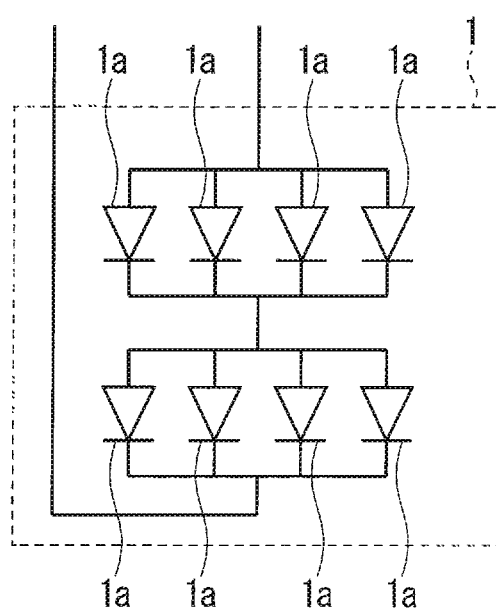
FIG. 3 is a diagram schematically illustrating yet another configuration of the semiconductor laser bank according to the first embodiment.

Here, in the semiconductor laser bank 1 of FIG. 1, the plurality of semiconductor laser light source elements 1a are connected in series, but the connection is not limited thereto on condition that an electric current can be applied uniformly from the drive circuit 2 to each of the semiconductor laser light source elements 1a. For example, as illustrated in FIG. 2, the plurality of semiconductor laser light source elements 1a may be connected in parallel, or as illustrated in FIG. 3, the plurality of semiconductor laser light source elements 1a may be connected in series and parallel in combination.

Out of a light 11 output from the semiconductor laser bank 1 (all of the plurality of semiconductor laser light source elements 1a), a light 11a reflected by the mirror 3 is used as a final optical output of the laser light source device 100, and a light 11b passing through the mirror 3 enters the light intensity detection circuit 4.

The light intensity detection circuit 4 detects light intensity of the light 11b, and the light ADC 5 converts an analog value of the detected light intensity into a digital value to output the digital value to the control circuit 9. The control circuit 9 calculates light intensity of the light 11 output from the semiconductor laser bank 1 (or light intensity of the final light 11a of the laser light source device 100) based on the light intensity (optical output value) from the light ADC 5.

In the first embodiment having such a configuration as above, the light intensity detection part for detecting light intensity output from the semiconductor laser bank 1 is formed of the light intensity detection circuit 4, the light ADC 5, and the control circuit 9. However, the light intensity detection part is not limited to such a configuration, and may be, for example, implemented by the light intensity detection circuit 4 alone. Note that, for the sake of convenience, description is given below assuming that the light intensity detection circuit 4 detects light intensity output from the semiconductor laser bank 1.

The temperature detection circuit 6 is, for example, formed of a temperature sensor, and detects a temperature (Tm) of the semiconductor laser bank 1. Note that, the temperature detection circuit 6 may detect a mean value of the temperatures detected in a part of the semiconductor laser light source elements 1a as the temperature of the semiconductor laser bank 1. Alternatively, in a case where the semiconductor laser bank 1 has a casing for covering the plurality of semiconductor laser light source elements 1a, the temperature detection circuit 6 may detect the temperature of the casing as the temperature of the semiconductor laser bank 1. The temperature ADC 7 converts an analog value of the temperature detected by the temperature detection circuit 6 into a digital value to output the digital value to the control circuit 9.

The cooling circuit 8 has a configuration capable of cooling the semiconductor laser bank 1. As the cooling circuit 8, for example, a Peltier element, a water-cooling cooling mechanism, and the like are applicable.

The control circuit 9 controls an electric current of the drive circuit 2 based on light intensity detected by the light intensity detection circuit 4 and the like such that the final optical output (light 11a) of the laser light source device 100 is fixed. Further, the control circuit 9 controls cooling of the cooling circuit 8 based on the temperature from the temperature ADC 7 (temperature detected by the temperature detection circuit 6) such that the temperature (Tm) of the semiconductor laser bank 1 is fixed within, for example, from 25° C. to 45° C.

Note that, the control circuit 9 being a processing circuit may be dedicated hardware, or may be a CPU (also referred to as a central processing unit, a central processor, a processing unit, an arithmetic unit, a microprocessor, a microcomputer, a processor, or a DSP) for executing a program stored in memory. Note that, as the control circuit 9, for example, a single circuit, a composite circuit, a programmed processor, a processor for a parallel program, an ASIC, an FPGA, or a combination thereof is applicable.

Here, at the time of activation when the ambient temperature is low, the temperature (Tm) of the semiconductor laser bank 1 may be extremely low. In such a case, COD deterioration may be caused due to an extremely large optical output from the semiconductor laser light source elements 1a.

In the first embodiment, in order to prevent such deterioration, an electric current limit value (limit value of an electric current of the drive circuit 2) for preventing the occurrence of the damage of COD is provided, and the control circuit 9 is configured to limit an electric current to the semiconductor laser light source elements 1a based on the electric current limit value.

Figure 4:
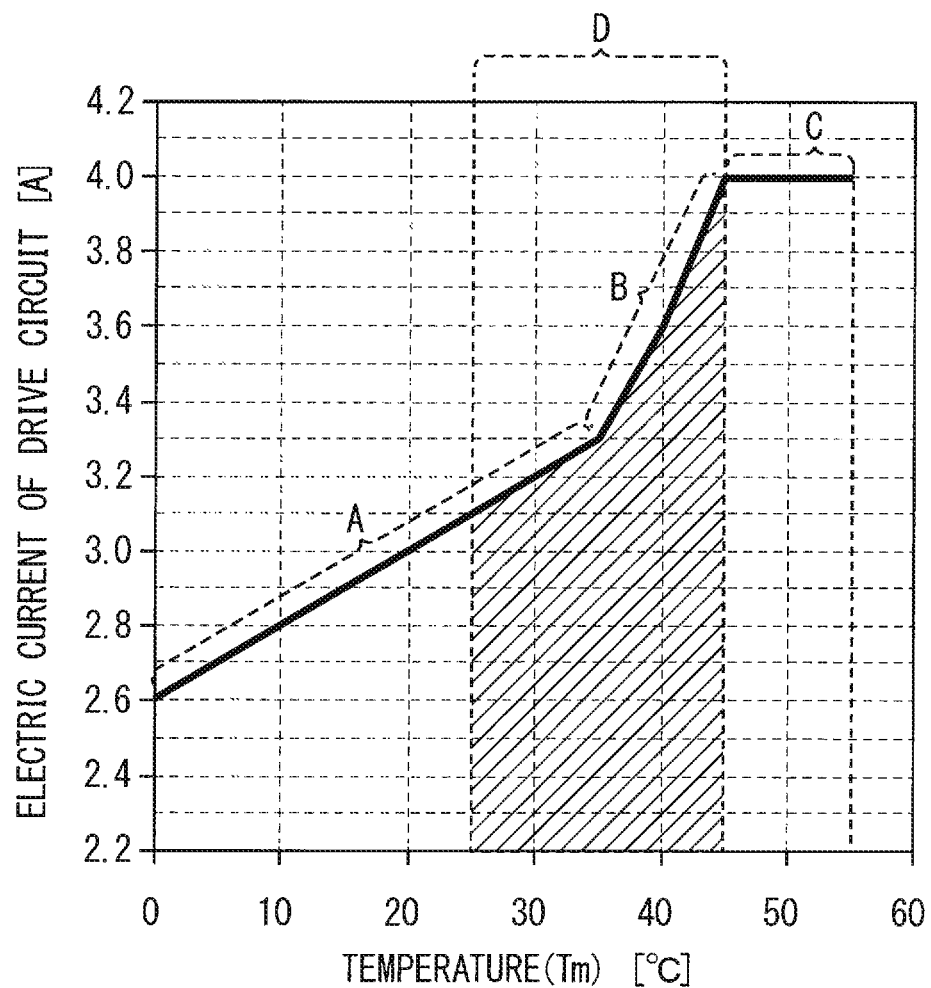
FIG. 4 is a graph showing an example of a relationship between temperature of the semiconductor laser bank and an electric current limit value.

FIG. 4 is a graph showing an example of a relationship between the temperature of the semiconductor laser bank 1 and an electric current upper limit value (electric current t value). The straight line in the zone A denotes an electric current upper limit value for preventing individual semiconductor laser light source elements 1a from being incapable of satisfying a required life due to COD deterioration. The zone B denotes an electric current upper limit value for preventing individual semiconductor laser light source elements 1a from being incapable of satisfying a required life due to COD deterioration and gentle thermal deterioration. The straight line in the zone C denotes an electric current upper limit value that can be tolerated mainly by internal wiring, components, and the like. The zone D is a target temperature setting zone of the temperature (Tm) of the semiconductor laser bank 1 (herein from 25° C. to 45° C.).

In this example of FIG. 4, the zone A (first temperature range) and the zone B (second temperature range) having higher temperature than the zone A are defined for the temperature (Tm) of the semiconductor laser bank 1. Further, a change of the electric current upper limit value (electric current limit value) with respect to a temperature change within the zone A is smaller than a change of the electric current upper limit value (electric current limit value) with respect to a temperature change within the zone B. Note that, the graph of FIG. 4, or a table, a function, or the like that corresponds to the graph of FIG. 4 is stored in the control circuit 9, for example.

Here, the control circuit 9 determines an electric current limit value (electric current upper limit value) using the graph of FIG. 4, or a table, a function, or the like that corresponds to the graph of FIG. 4 based on the temperature detected by the temperature detection circuit 6. Then, the control circuit 9 controls an electric current of the drive circuit 2 based on the light intensity detected by the light intensity detection circuit 4 and the determined electric current limit value (electric current upper limit value).

In the first embodiment, the control circuit 9 determines, by carrying out optical output automatic control, an electric current value of an electric current of the drive circuit 2 based on the light intensity detected by the light intensity detection circuit 4. Then, the control circuit 9 controls an electric current of the drive circuit 2 based on the electric current limit value in a case where the determined electric current value exceeds the electric current limit value (electric current upper limit value), and controls an electric current of the drive circuit 2 based on the determined electric current value in a case where the determined electric current value does not exceed the electric current limit value (electric current upper limit value).

Figure 5:
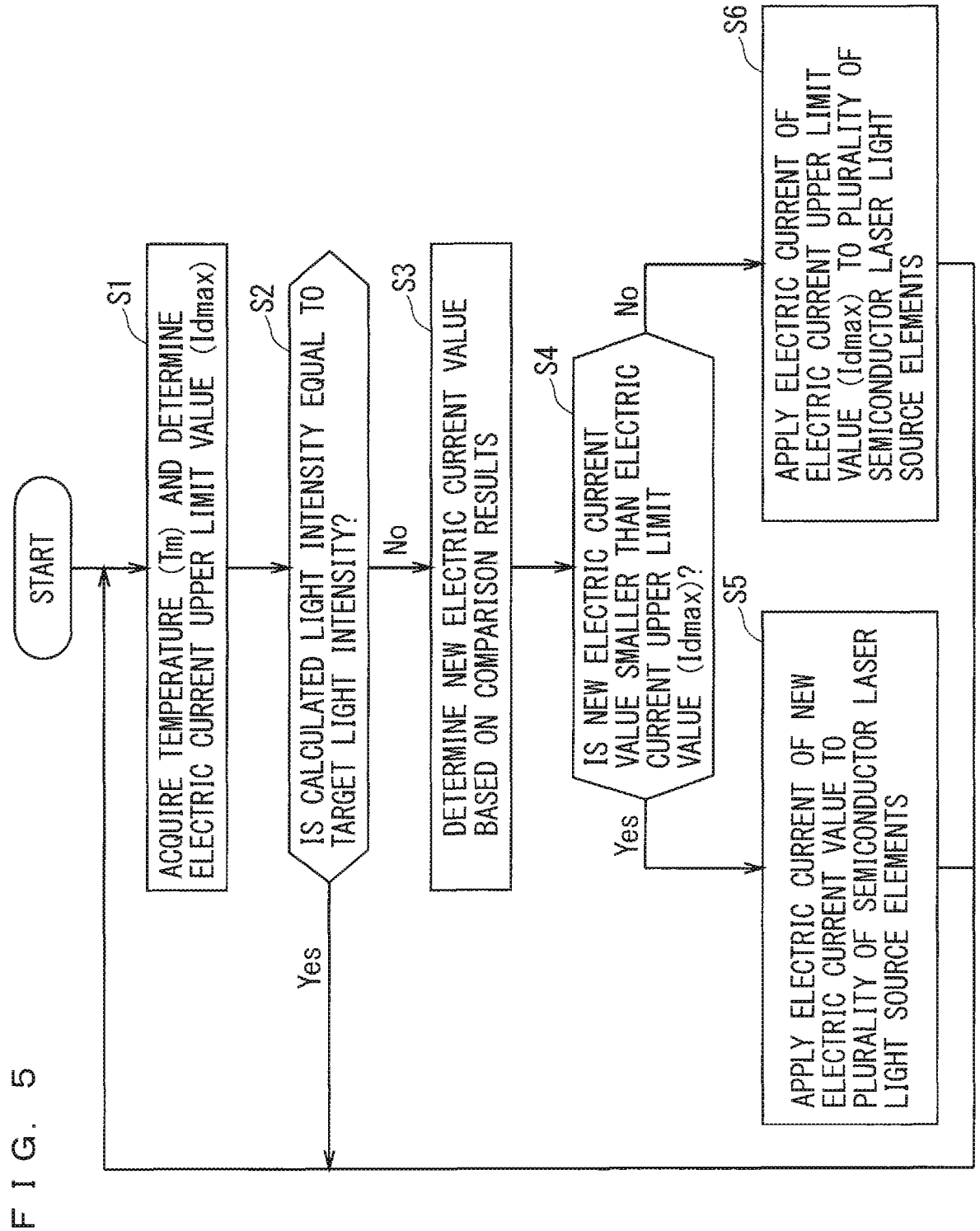
FIG. 5 is a flowchart illustrating operations of the laser light source device according to the first embodiment.

FIG. 5 is a flowchart illustrating operations (APC, i.e., optical output automatic control) of the laser light source device 100 according to the first embodiment.

Firstly, in Step S1, the control circuit 9 acquires the temperature (Tm) of the semiconductor laser bank 1 from the temperature detection circuit 6 via the temperature ADC 7, and determines an electric current upper limit value (Idmax) using the table of FIG. 4 or the like.

In Step S2, the control circuit 9 calculates light intensity of the light 11 (or light intensity of the light 11a) based on the light intensity detected by the light intensity detection circuit 4 and the like, and determines whether or not the calculated light intensity is equal to target light intensity. The processing returns to Step S1 in a case where determination of being equal is made, and the processing proceeds to Step S3 in a case where determination of not being equal is made.

In Step S3, the control circuit 9 determines an electric current value lower than the present electric current value of the drive circuit 2 as a new electric current value in a case where the calculated light intensity is larger than a target light intensity, and determines an electric current value higher than the present electric current value of the drive circuit 2 as a new electric current value in a case where the calculated light intensity is smaller than a target light intensity.

In Step S4, the control circuit 9 determines whether or not the new electric current value determined in Step S3 is smaller than the electric current upper limit value (Idmax) determined in Step S1. The processing proceeds to Step S5 in a case where determination that the new electric current value is smaller than the electric current upper limit value (Idmax) is made, and the processing proceeds to Step S6 in a case where determination that the new electric current value is the electric current upper limit value (Idmax) or larger is made.

In Step S5, the control circuit 9 outputs the new electric current value determined in Step S3 to the drive circuit 2, and the drive circuit 2 applies an electric current of the new electric current value to the plurality of semiconductor laser light source elements 1a. After that, the processing returns to Step S1.

In Step S6, the control circuit 9 outputs the electric current upper limit value (Idmax) determined in Step S1 to the drive circuit 2, and the drive circuit 2 applies an electric current of the electric current upper limit value (Idmax) to the plurality of semiconductor laser light source elements 1a. After that, the processing returns to Step S1.

Note that, the control circuit 9 may determine to be incapable of exerting an optical output of target light intensity in a case where the electric current upper limit value (Idmax) continues for a certain period of time. Then, at the time, the control circuit 9 may lower the target light intensity, or may make a voice output device (not shown) issue an alarm.

According to the laser light source device 100 of the first embodiment as described above, an electric current of the drive circuit 2 is limited using an electric current limit value. With this, if outputs of some of the semiconductor laser elements are extremely low, or, for example, if the temperature of the semiconductor laser elements is low at the time of an activation operation, an extremely large optical output of the semiconductor laser elements can be prevented. Accordingly, generation of COD can be suppressed, and life deterioration can be suppressed. Further, in the first embodiment, a plurality of semiconductor laser elements are driven and controlled by a single drive circuit 2 and a single control circuit 9. For this reason, a high-speed APC circuit and a drive circuit are not required for each of the plurality of semiconductor laser elements, and therefore a circuit scale can be reduced.

Note that, in the present invention, the embodiment may be modified or omitted as appropriate within the scope of the invention.

The present invention has been described in detail, but the above description is in all aspects illustrative, and the present invention is not to be limited thereto. It is understood that unillustrated numerous modification examples are assumable without departing from the scope of the present invention.

EXPLANATION OF REFERENCE SIGNS 1 semiconductor laser bank, 1a semiconductor laser light source element, 2 drive circuit, 4 light intensity detection circuit, 6 temperature detection circuit, 9 control circuit, 100 laser light source device

The invention claimed is:
1. A laser light source device comprising:
    a laser bank having a plurality of semiconductor laser elements;
    a drive part for applying an electric current to the plurality of semiconductor laser elements of the laser bank;
    a light intensity detection part for detecting light intensity output from the laser bank;
    a temperature detection part for detecting a temperature of the laser bank; and
    a control part for determining an electric current limit value being a limit value of the electric current of the drive part based on the temperature detected by the temperature detection part, and for controlling the electric current of the drive part based on the light intensity detected by the light intensity detection part and the electric current limit value, wherein a first temperature range and a second temperature range that is higher than the first temperature range are defined for the temperature of the laser bank, the electric current limit value comprises an electric current upper limit value for preventing COD deterioration of the plurality of semiconductor laser elements in the first temperature range, and an electric current upper limit value for preventing COD deterioration and gentle thermal deterioration of the plurality of semiconductor laser elements in the second temperature range, a change of the electric current limit value with respect to a temperature change within the first temperature range is fixed, and a change of the electric current limit value with respect to a temperature change within the second temperature range is fixed wherein the change of the electric current limit value with respect to the temperature change within the first temperature range is smaller than the change of the electric current limit value with respect to the temperature change within the second temperature range.

2. The laser light source device according to claim 1, wherein the control part determines, as optical output automatic control, an electric current value of the electric current of the drive part based on the light intensity detected by the light intensity detection part, and controls the electric current of the drive part based on the electric current limit value in a case where the electric current value exceeds the electric current limit value.

3. The laser light source device according to claim 2, wherein the control part controls, as optical output automatic control, the electric current of the drive part based on the electric current value in a case where the electric current value does not exceed the electric current limit value.

4. A method of controlling a laser light source device, the method comprising:

detecting a temperature of a laser bank having a plurality of semiconductor laser elements;

detecting light intensity output from the laser bank; and determining an electric current limit value being a limit value of an electric current applied to the plurality of semiconductor laser elements of the laser bank based on the detected temperature of the laser bank, and controlling the electric current based on the detect light intensity and the electric current limit value, wherein a first temperature range and a second temperature range that is higher than the first temperature range are defined for the temperature of the laser bank, the electric current limit value comprises an electric current upper limit value for preventing COD deterioration of the plurality of semiconductor laser elements in the first temperature range, and an electric current upper limit value for preventing COD deterioration and gentle thermal deterioration of the plurality of semiconductor laser elements in the second temperature range, a change of the electric current limit value with respect to a temperature change within the first temperature range is fixed, and a change of the electric current limit value with respect to a temperature change within the second temperature range is fixed wherein the change of the electric current limit value with respect to the temperature change within the first temperature range is smaller than the change of the electric current limit value with respect to the temperature change within the second temperature range.

* * * * *